United States Patent
Lubitz et al.

(10) Patent No.: US 7,654,126 B2
(45) Date of Patent: Feb. 2, 2010

(54) METHOD FOR ESTABLISHING A CORRELATION BETWEEN A FIRST STATE OF A PIEZOELECTRIC COMPONENT AND A SECOND STATE OF THE COMPONENT AND USE OF SAID CORRELATION

(75) Inventors: Karl Lubitz, Ottobrunn (DE); Carsten Schuh, Baldham (DE); Andreas Wolff, Munich (DE)

(73) Assignee: Siemens Aktiengesellschaft, Munich (DE)

( * ) Notice: Subject to any disclaimer, the term of this patent is extended or adjusted under 35 U.S.C. 154(b) by 228 days.

(21) Appl. No.: 10/597,104

(22) PCT Filed: Jan. 12, 2005

(86) PCT No.: PCT/EP2005/050111

§ 371 (c)(1), (2), (4) Date: Jul. 11, 2006

(87) PCT Pub. No.: WO2005/067069

PCT Pub. Date: Jul. 21, 2005

(65) Prior Publication Data

US 2007/0151320 A1  Jul. 5, 2007

(30) Foreign Application Priority Data

Jan. 12, 2004  (DE)  ........................ 10 2004 001 696

(51) Int. Cl.
  G01L 25/00 (2006.01)
  H01L 41/24 (2006.01)
(52) U.S. Cl. ........................................ 73/1.15; 702/116
(58) Field of Classification Search .................. 73/1.15; 702/115–116
See application file for complete search history.

(56) References Cited

U.S. PATENT DOCUMENTS 4,088,917 A  5/1978  Martin et al. ................ 310/357

(Continued)

FOREIGN PATENT DOCUMENTS

DE  247083 A1  6/1987

(Continued)

OTHER PUBLICATIONS

Jaffe et al. "Piezoelectric Ceramics" Academic Press (pp. 253-267), 1971.
International Search Report and Written Opinion for International Application No. PCT/EP2005/050111 (9 pages), Oct. 14, 2005.

Primary Examiner—Thomas P Noland
(74) Attorney, Agent, or Firm—King & Spalding L.L.P.

(57) ABSTRACT

A method for producing a correlation between a first state of a piezoelectric component (1, 20) comprising a piezoceramic element and a second state of the component comprises the following steps: a) a first group of components respectively in the first state is prepared (101), b) at least one defined characteristic of each component of the first group is determined (102), c) the piezoceramic element of the components of the first group is polarised, and a corresponding component of a second group in the second state is thus created from each component of the first group (103), d) at least one defined characteristic of each component of the second group is determined (104), and e) the correlation is produced by comparing the defined characteristics of each component of the first group with the defined characteristic of the corresponding component of the second group (105).

14 Claims, 2 Drawing Sheets

U.S. PATENT DOCUMENTS

| | | | |
|---|---|---|---|
| 5,308,462 A | 5/1994 | Iijima et al. | 204/192.15 |
| 5,501,876 A | 3/1996 | Gesemann et al. | 427/226 |
| 6,046,526 A | 4/2000 | Maruyama | 310/323.06 |
| 6,464,925 B1 * | 10/2002 | Tomohiro et al. | 264/435 |
| 6,521,166 B1 * | 2/2003 | Tomohiro et al. | 264/408 |
| 6,761,831 B2 | 7/2004 | Borchers et al. | 252/62.9 R |
| 7,440,861 B2 * | 10/2008 | Ausserlechner et al. | 73/1.15 X |
| 2002/0173573 A1 | 11/2002 | Borchers et al. | 524/413 |
| 2004/0219351 A1 | 11/2004 | Borchers et al. | 428/323 |

FOREIGN PATENT DOCUMENTS

| | | |
|---|---|---|
| DE | 4325167 C1 | 9/1994 |
| DE | 19756182 C2 | 10/1999 |
| DE | 10104604 A1 | 8/2002 |

\* cited by examiner

METHOD FOR ESTABLISHING A CORRELATION BETWEEN A FIRST STATE OF A PIEZOELECTRIC COMPONENT AND A SECOND STATE OF THE COMPONENT AND USE OF SAID CORRELATION

CROSS-REFERENCE TO RELATED APPLICATIONS

This application is a U.S. national stage application of International Application No. PCT/EP2005/050111 filed Jan. 12, 2005, which designates the United States of America, and claims priority to German application No. DE 10 2004 001 696.8 filed Jan. 12, 2004, the contents of which are hereby incorporated by reference in their entirety.

TECHNICAL FIELD

The invention relates to a method for establishing a correlation between a first state of a piezoelectric component, having a piezoceramic element, and a second state of the component. A use of said correlation is also specified.

BACKGROUND

The piezoelectric component is for example a piezoelectric actuator with a monolithic actuator body. The actuator body for example comprises a number of piezoelements arranged one on top of the other. A single piezoelement has at least two electrode layers arranged one on top of the other in a stacking direction and at least one piezoelectric layer containing the piezoceramic element (piezoceramic layer) arranged between the electrode layers. The piezoelements are arranged such that electrode layers and piezoelectric layers are arranged in an alternating manner one on top of the other. Each of the electrode layers, referred to as internal electrodes, functions as the electrode layer of adjacent piezoelements. For the purposes of electric contact with the electrode layers, adjacent electrode layers are guided in an alternating manner to two lateral surface sections of the actuator body, which are insulated electrically from each other. The actuator body has strips of metallic coating on each of these surface sections.

A piezoelectrically active region of the piezoceramic layer is located between the electrode layers of the respective piezoelement. Electrical activation of the electrodes causes a relatively homogeneous electric field to be induced in this region of the piezoceramic layer. Homogeneous deflection of the piezoceramic layer results over the entire piezoelectrically active region. In contrast every piezoceramic layer is piezoelectrically inactive in the region of the described surface sections. The alternating guiding of the electrode layers to the surface sections causes an electric field to be injected into the piezoelectrically inactive region of the piezoceramic layer, which is significantly different from the electric field injected into the piezoelectrically active region of the piezoceramic layer. During electrical activation of the electrode layers, in other words during polarization and/or during operation of the piezoactuator, the different electric (polarization) fields cause different deflections of the piezoceramic layer in the piezoelectrically active region and in the piezoelectrically inactive region. As a result mechanical stresses occur in the piezoelement, which can lead to what is known as a poling fissure at right angles to the stacking direction. This poling fissure can continue into the metallic coating attached to the surface sections of the actuator body. This causes a break in the electric contact of at least some of the electrode layers of the actuator body.

To reduce the probability of poling fissures occurring during polarization of a monolithic actuator body, a specific polarization method is specified in DE 197 56 182 C2 for the piezoactuator described above. The actuator body comprises several hundred piezoceramic layers and electrode layers arranged in an alternating manner. The piezoceramic layers are made of a lead zirconate titanate (PZT). The electrode layers are made of a silver-palladium alloy. To produce the actuator body, ceramic green films are printed with a silver-palladium paste, stacked one on top of the other, separated from the binder and sintered in a common manner.

According to the polarization method, during the application of a polarization field a mechanical compressive stress is applied at the actuator body, counteracting the elongating effect of the polarization field. This reduces the degree of the change in expansion of the piezoceramic layer in the piezoelectrically active region. A lower level of mechanical stress results in the actuator body. The probability of the occurrence of poling fissures in the actuator body is thus reduced by the method described.

The poling of the actuator body is however only one of a number of work steps required to obtain a piezoactuator that is suitable for corresponding applications. One application of the piezoactuator is for example the activation of an injection valve in an engine in a motor vehicle. The further work steps are carried out before or after polarization. For example electrical connector elements are attached to the metallic coating strips. The actuator body is generally also sealed with a plastic compound. This protects the surface of the actuator body against mechanical destruction or against electrical arcing between adjacent electrode layers. Furthermore the actuator body is not only poled under a mechanical compressive stress, it is also operated under a mechanical compressive stress. This means that the actuator body is pretensioned. To this end the actuator body (sealed with a plastic compound) is for example welded into a Bourdon spring.

At the end of the production chain described above, it must be verified whether the piezoactuator can be used in the required manner. The quality of the piezoactuator must be determined. The quality relates in particular to piezoelectric parameters of the piezoactuator, for example its $d_{33}$ coefficients. It often turns out that the piezoactuator produced has piezoelectric parameters that exclude the use of the piezoactuator. Such an exclusion is frequently due to defects that occur due to sintering.

SUMMARY

The object of the invention is therefore to demonstrate how information about the quality of an actuator body can be obtained after sintering.

To achieve this object, a method is specified for establishing a correlation between a first state of a piezoelectric component, having a piezoceramic element, and a second state of the component, with the second state of the component being generated from the first state of the component by polarization of the piezoceramic element of the component. The method has the following method steps: a) provision of a first group of components each with the first state, b) determination of at least one specific characteristic of each of the components of the first group, c) polarization of the piezoceramic element of the components of the first group, with a corresponding component of a second group resulting from each of the components of the first group and having the second state, d) determination of at least one specific characteristic of each of the components of the second group and e) establishment of the correlation by comparing the specific characteristics of each of the components of the first group and the specific characteristic of the corresponding component of the second group.

According to a second aspect of the invention, the established correlation is used to predict the specific characteristic of a specific piezoelectric component with the second state from the determined characteristic of the specific component with the first state.

The piezoelectric component can be any piezoelectric component that is poled for use. The piezoceramic element of the component is polarized. The poling of the component or the polarization of the piezoceramic element causes a (poling) state that is suitable for the operation of the component to be generated. This state is the second state of the component.

The piezoelectric component is a piezoelectric bending actuator for example. The bending actuator has a piezoelement or a number of piezoelements arranged in a suitable manner in relation to each other. The piezoelectric component is in particular a piezoactuator as described in the introduction with an actuator body having a monolithic multilayer structure. However an actuator body, in which the individual piezoelements are not connected together in a monolithic manner, is also possible. The piezoelements are for example stuck together.

The idea underlying the invention is to establish an empirical relationship (correlation) between the (initial) state of the component before polarization of the piezoceramic element and the (poling) state of the component after polarization of the piezoceramic element. To this end suitable characteristics (e.g. physical parameters or chemical composition) of a number of the components before polarization are determined, then each of the components is poled and the characteristics (e.g. piezoelectric parameters) of the components after poling are then determined. The correlation is determined by comparing the characteristics of the components in the initial state with the characteristics of the respective component in the poling state. With knowledge of the correlation, it is possible to estimate the characteristics of a specific component that can be expected after poling beforehand based on the characteristics of the component in the initial state. It is possible to conclude the characteristics of the component obtained after polarization of the piezoceramic element with a certain probability. It is therefore possible to make an initial selection for the further treatment of the components. Components, the expected characteristics of which are not within a tolerance range to be specified, are rejected and not processed further. If the expected characteristics based on the determined correlation are within the tolerance range, the component is released for further processing. It is possible with the described procedure to carry out quality assurance at a relatively early stage of production of the piezoelectric component.

According to a particular embodiment a number of specific characteristics of the component with the first state are determined and used to establish the correlation with the specific characteristics of the component with the second state. This means that more than one characteristic of the component in the first state is determined, in order to conclude the characteristic or characteristics of the component in the second state. By determining more than one characteristic of the component in the state before polarization, it is possible to increase the reliability of the prediction about the characteristics of the component in the state after polarization. This helps make the prediction about the suitability of a component for a specific application more reliable.

In a particular embodiment the specific characteristic of the component with the first state is selected from the group loss angle (tan δ) of the piezoelectric layer, insulation resistance of the piezoelectric layer, density of the piezoelectric layer, relative permittivity of the piezoelectric layer, ferroelastic behavior of the component, module of elasticity (E module) of the component, longitudinal sound velocity of the component and/or temperature sensitivity of the capacity of the component. At least one physical parameter is selected from those mentioned. As specified above, preferably more than one of the listed physical parameters is determined, to establish the correlation between the states of the component.

The component is energized mechanically for example to determine the modulus of elasticity or sound velocity. Ferroelastic behavior is determined for example by a one-off compressive load on the component. What is referred to as a stress-strain curve can be acquired by applying a compressive stress to the component (compressive load on the component). With a smaller compressive stress the elongation of the component is a linear function of the applied compressive stress. With a greater compressive stress the elongation is no longer a linear function of the compressive stress. To determine the ferroelastic behavior of the component, the one-off compressive load is applied into the non-linear region of the stress-strain curve as described. Ferroelastic behavior is for example characterized by the compressive stress at which a deviation from linearity is observed and by the residual change in length (shortening) of the component after the compressive load, as induced by the compressive stress. A further variable is what is referred to as coercive pressure, in other words the compressive stress required to depolarize a poled component again.

The piezoceramic element of the component can thereby form a composite material together with further materials. In the case of a piezoelement as described above, the piezoelectric layer can for example comprise a polymer matrix, in which piezoceramic particles are embedded. However the piezoelectric layer is preferably formed solely by the piezoceramic element.

The piezoceramic element can be any piezoceramic material or a mixture of a number of piezoceramic materials. A lead zirconate titanate (Pb(Ti,Zr)O3, PZT) in particular is used as the piezoceramic element. The PZT is a perovskite (ABO$_3$). The A sites of the perovskite are occupied by lead. The B sites of the perovskite are taken up by titanium and zirconium. The lead zirconate titanate can thereby also be doped. For example the PZT has rare earth doping.

When a piezoceramic with lead zirconate titanate is used, in a particular embodiment a ratio of a rhombohedric part by volume with a rhombohedric phase and a tetragonal part by volume with a tetragonal phase is used as the specific characteristic of the component with the first state. The PZT mixed crystal system (PbZr$_x$Ti$_{(1-x)}$O3) is characterized by a continuous miscibility of the lead zirconate (PbZrO$_3$, PZ) and the lead titanate (PbTiO$_3$, PT). At a temperature above the Curie temperature (T$_c$) the PZT crystallizes irrespective of the zirconium-titanium ratio in a paraelectric, cubic perovskite structure. If the temperature is below the Curie temperature, spontaneous distortion of the cubic lattice occurs. Different phases thereby result as a function of the zirconium-titanium ratio. Titanium-rich mixed crystals (0.47 >x>0) form a ferroelectric mixed crystal phase with a tetragonal lattice structure (tetragonal phase) at room temperature. Crystallites of the tetragonal phase are characterized by 180° and 90° domains. Zirconium-rich mixed crystals (0.47<x<0) in contrast form a ferroelectric mixed crystal phase with a rhombohedric lattice structure (rhombohedric phase) at room temperature. Crystallites of the rhombohedric phase are characterized by 180°, 71° and 109° domains. The zirconium-titanate ratio at which both ferroelectric phases are present is referred to as the morphotropic phase boundary. The morphotropic phase boundary thus refers to a region of coexistence, in which the tetragonal phase and the rhombohedric phase exist side by side.

It has proven that the ratio of the part by volume of the tetragonal phase to the part by volume of the rhombohedric phase has a strong influence on the piezoelectric characteristics of the poled component. It is deduced from this that with knowledge of the ratio of the parts by volume it is possible to conclude the piezoelectric characteristics of the component with a high level of probability. It is verified whether the morphotropic phase boundary is present after sintering. If the morphotropic phase boundary is present, a conclusion can be drawn with a certain probability about whether the component subsequently obtained after polarization will have the necessary piezoelectric parameters.

X-ray structure analysis can be used to determine the morphotropic phase boundary. This analysis however only gives the ratio of the surface elements of the phases on the surface of the component being examined. The ratio of the parts by volume can be concluded from the ratio of the surface elements.

To avoid the transfer from the ratio of surface elements to the ratio of parts by volume as described, which is subject to a high level of uncertainty, parameters are preferably determined, which react in a very sensitive manner to the ratio of the parts by volume of the two phases. In particular the determination of the physical parameters described above is used to determine the morphotropic phase boundary. These parameters react in a very sensitive manner to the ratio of the parts by volume of the tetragonal and rhombohedric phases of the piezoceramic element to each other. Thus for example it is possible to determine the ratio of the parts by volume by determining the density (from the dimensions and weight of the component). The greater the density, the larger the proportion of the rhombohedric phase. Also the determination of the relative dielectricity constant of the piezoceramic element from measured capacity at a defined temperature (e.g. 20° C.) and precisely determined structural data of the component (e.g. layer thicknesses of the piezoceramic layer and the electrode layers of a piezoelement) are highly suited to the determination of the morphotropic phase boundary. The further parameters mentioned above are loss angle (tan δ) of the piezoelectric layer, insulation resistance of the piezoelectric layer, ferroelastic behavior of the component, module of elasticity (E module) of the component, longitudinal sound velocity of the component and/or temperature sensitivity of the capacity of the component. In order to be able to draw a relatively precise conclusion about the morphotropic phase boundary, a number of the described physical characteristics are preferably determined.

The characteristics of the component are generally determined after the component has been sintered and before it has been further processed. In this state the component is not poled. In a particular embodiment however components of the first group are used, the first state of which is characterized by partial polarization of the piezoceramic element. Prepoled or weakly poled piezoceramic components are used. The components are preferably poled such that no prior damage occurs to the component. A poling fissure, as described above, in an actuator body having a monolithic multilayer structure would be such prior damage. To prevent poling fissures in the actuator body, the piezoceramic element of the actuator body is polarized to a degree that is far removed from polarization saturation. It should be noted that no poling fissures are present in the residual state, in other words in the permanently poled state.

A unipolar polarization field is generated to polarize the piezoceramic element of the components. A unipolar polarization field with "direct field strength" is therefore used. A linear ramp (increase or decrease in the field strength over time) and/or retention time of the field strength can thereby be provided. It is also possible to have a polarization field with a pulsing direct field. The frequency of such a polarization field is thereby preferably selected such that no heating of the piezoceramic element results.

There are various options for partially polarizing the piezoceramic element of the components. Preferred polarization methods and preferred conditions, in which the polarization method is implemented, are set out below. The polarization methods and conditions, in which the components are prepoled, should be used according to the components or can be combined.

For the purposes of partial polarization, the piezoceramic element of the components is for example polarized without pressure at room temperature. This means that no mechanical compressive stress is exerted on the component during application of the polarization field. All the 180° domains of the crystallites of the tetragonal phase and the rhombohedric phase are thereby predominantly switched in the field direction.

Alternatively for the purposes of partial polarization, the piezoceramic element of the components is polarized at a polarization temperature that is higher than room temperature. Room temperature is considered to be around 20° C. with a deviation of up to ±10° C. The component can thereby be heated to a temperature that is below the Curie temperature of the piezoceramic element during the entire poling process. A polarization field with relatively low field strength is then applied as the component cools to room temperature. The field strength of this polarization field is for example less than 100 V/mm.

For the purposes of partial polarization of the piezoceramic element, a mechanical compressive stress can also be exerted on the piezoceramic element of the component. Pressure polarization then takes place. The compressive stress applied can thereby be below the compressive stress, at which the component may later be operated. For example, in the case of an actuator body having a monolithic multilayer structure, a pressure of 10 MPa to 20 MPa can be applied during poling of the component.

In the case of a weakly poled component, the above-mentioned physical measured variables to be determined can be used to establish the correlation. In particular, to determine the morphotropic phase boundary and thus to establish the correlation, a relative permittivity of the piezoceramic element before weak poling ($\in_{rv}$) and a relative permittivity of the piezoceramic element after weak poling ($\in_{rn}$) can be determined. The relative change in permittivity ($\in_{rn} - \in_{rv}$)/$\in_{rv}$) is a measure of the ratio of the parts per volume of the rhombohedric phase and the tetragonal phase. The field dependency of the polarization charge (P(E)) and the maximum polarization $P_{max}$ similarly result in a usable correlation between the initial state and the poling state of the component.

It should also be noted that no disadvantages have to be offset against the described weak poling of the component. As set out above, poling is configured such that no damage occurs to the component. Furthermore the weakly poled piezoelectric component can be converted to an unpoled state for further processing using known methods. For example the weakly poled component can be depolarized by heating to above the Curie temperature or by applying an alternating field with an amplitude that decreases over time.

As far as the use of the correlation is concerned, the quality of a component is preferably judged based on the prediction possibility. Furthermore the correlation is used to configure a polarization method, with which the piezoceramic element of the component can be polarized such that a component with a specific second state is obtained. The specific characteristics of the component and the determined correlation give an indication of how the polarization method must be configured to obtain a functional component. For example information is obtained about whether the component should be polarized under a specific compressive stress.

As mentioned above, any piezoelectric components can be used. A piezoelectric component is preferably used that has at least one piezoelement with at least two electrode layers arranged one on top of the other and at least one piezoelectric layer containing the piezoceramic element arranged between the electrode layers. According to a particular embodiment a multilayer actuator, in which a number of piezoelements are arranged to form a stacked actuator body, is used as the piezoelectric component.

To summarize, the present invention has the following significant advantages:

With the invention it is possible, at an early stage of the production of a piezoelectric component, having a piezoceramic element, to estimate the piezoelectric characteristics of said piezoelectric component and therefore its quality after polarization of the piezoceramic element. Components, which with all probability will not achieve the required piezoelectric parameters, can be excluded from further processing. This results in a significant reduction in production costs.

With the invention a defined interface can be set up between component producers and component processors (system users). The system user is supplied with a semi-finished product not a finished product. The unfinished product is for example what is known as a "bare stack", in other words a sintered, unpoled actuator body having a monolithic, multilayer structure, to which only the strips of metallic coating have been attached.

Such an actuator body is characterized with the aid of the invention.

The physical characteristics to establish the correlation and to be determined subsequently from the individual component as set out in the invention are simple to determine.

BRIEF DESCRIPTION OF THE DRAWINGS

The invention is described in more detail below based on a number of examples and the associated figures. The figures are schematic and do not represent scale diagrams.

DETAILED DESCRIPTION

Figure 2:
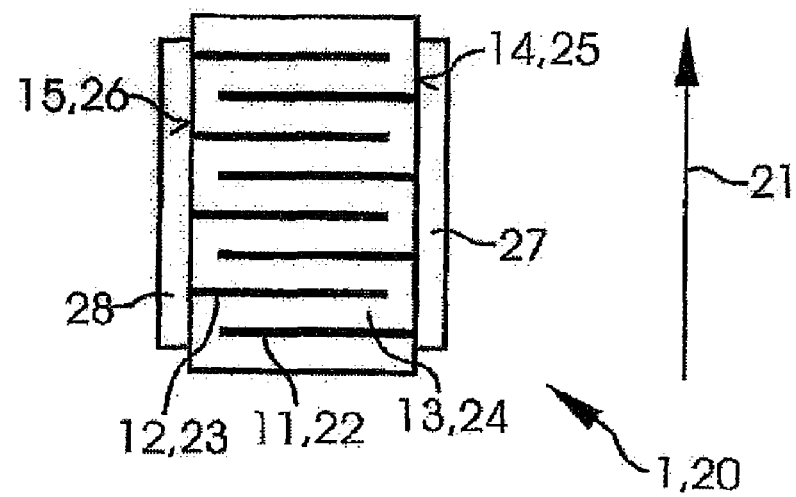
FIG. 2 shows a cross-section of a piezoelectric component in the form of a piezoactuator with an actuator body having a monolithic multilayer structure.
Figure 3:
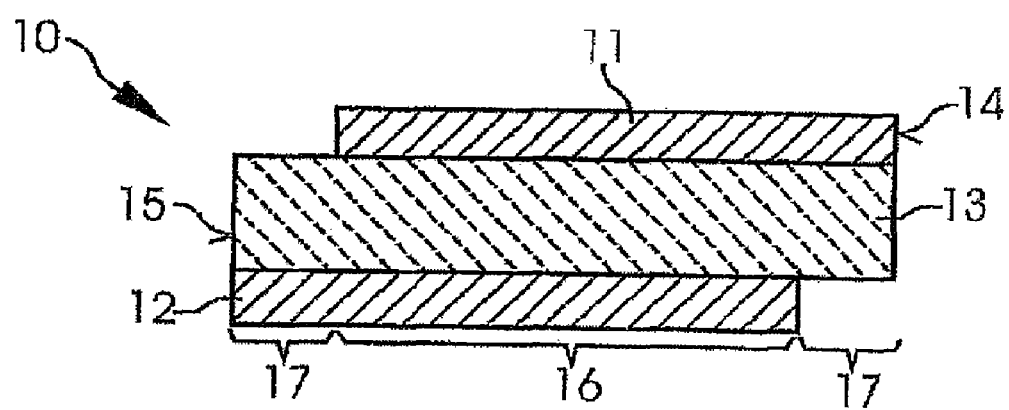
FIG. 3 shows a lateral cross-section of a piezoelement of the piezoactuator from FIG. 2.

The piezoelectric component 1 is a piezoactuator with an actuator body 20 having a monolithic multilayer structure with a square base surface (not shown) (FIG. 2). In this actuator body 20 a number of piezoelements are stacked one on top of the other in the stacking direction 21 of the actuator 20 and connected securely. The actuator body is made up of up to 1000 individual layers in total. A single piezoelement 10 thereby has a piezoelectric layer 13 made of a piezoceramic element (FIG. 3). The layer thickness of the piezoelectric layer 13 is 20 µm to 200 µm. The piezoceramic element is a PZT. The piezoelectric layer 13 of the piezoelement 10 is located between one electrode layer 11 and a further electrode layer 12 of the piezoelement 10. The electrode material of the electrode layers 11 and 12 is a silver-palladium alloy. The layer thickness of the electrode layer is 1 µm to 3 µm. The electrode layers 11 and 12 are arranged on the main surfaces of the piezoelectric layer 13 such that electrical activation of the electrode layers 11 and 12 causes an electric field to be generated in the piezoelectric layer 13. This electric field can function as a polarization field during poling of the actuator body, causing the piezoceramic element to be polarized. During operation of the piezoactuator 1 the electric field, in conjunction with polarization of the piezoceramic element, causes a specific deflection of the piezoelectric layer 13 and thus a specific deflection of the piezoelement 10.

For the purposes of electrical contact the electrode layers 11 and 12 are guided to two surface sections 14 and 15 that are insulated electrically from each other. At these points the two electrode layers 11 and 12 are each connected to an electrical connector element (not shown in FIG. 3). Because the electrodes 11 and 12 are guided to different surface sections 14 and 15, each piezoelement 10 has one piezoelectrically active region 16 and at least two piezoelectrically inactive regions 17.

Because a number of piezoelements 10 are stacked one on top of the other in the actuator body 20 having a monolithic multilayer structure, it is possible to achieve a relatively high absolute excursion along the stacking direction 21 of the actuator body 20 with a relatively low activation voltage.

Adjacent piezoelements 10 each have a common electrode layer, such that electrode layers 22, 23 and piezoelectric layers 24 are stacked one on top of the other in an alternating manner in the actuator body 20.

The electrode layers 22 and 23 of the actuator body 20 are guided to two lateral surface sections 25 and 26, which are insulated electrically from each other. The surface sections 25 and 26 are located at the corners of the actuator body 20. To produce the actuator body 20, ceramic green films are used with a square base surface, each being free from electrode material at one corner, being stacked correspondingly one on top of the other and being sintered in a common manner. Strips of metallic coating 27 and 28 are attached to both the surface sections 25 and 26, such that the electrode layers 23 and 24 have electric contact in an alternating manner. The actuator body 20 thus obtained is referred to as a "bare stack".

According to the method, a correlation is established between a first state and a second state of the actuator body 20. The first state of the actuator body 20 corresponds to the state after attachment of the metallic coatings 27 and 28 to the surface sections 25 and 26 of the actuator body 20. The actuator body 20 is thereby unpoled according to a first exemplary embodiment. In an alternative exemplary embodiment the actuator body 20 is weakly poled in the first state. In both instances the second state is the poling state of the actuator body 20, in which the actuator body 20 is operated.

Figure 1:
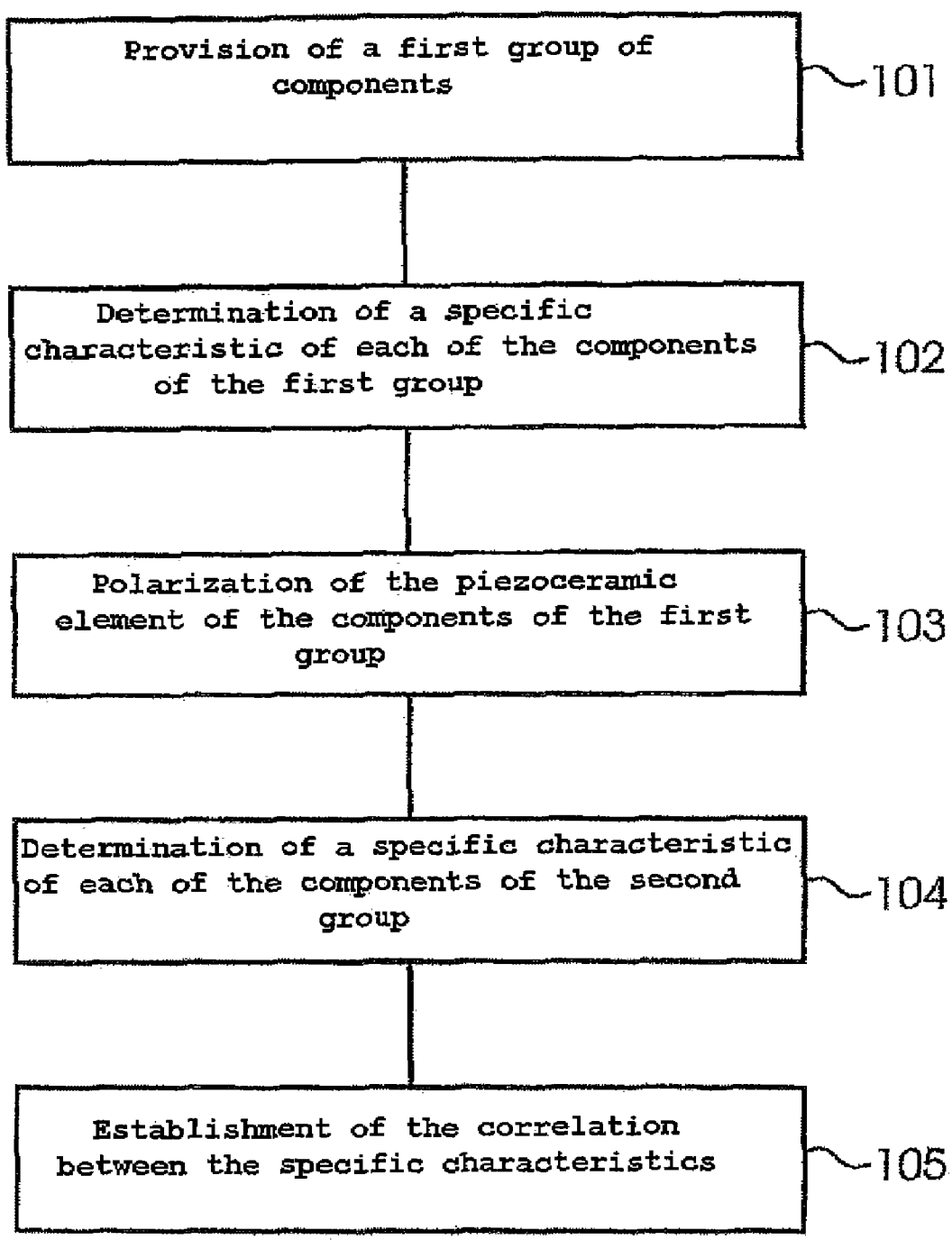
FIG. 1 shows a method for establishing the correlation.

To establish the correlation, a number of such actuator bodies 20 is first provided (FIG. 1, 101). A number of specific physical characteristics are then determined on each of the actuator bodies 20 (FIG. 1, 102). These include the density of the piezoceramic element, the temperature sensitivity of the capacity of the actuator body 20 and ferroelastic characteristics of the actuator body 20. These characteristics can be used to determine a further characteristic, namely to determine the morphotropic phase boundary of the PZT.

After determining the characteristic or characteristics of each of the actuator bodies 20, the actuator bodies 20 are poled by applying corresponding polarization fields. The PZT of the piezoelectric layers 24 is polarized (FIG. 1, 103). Poling thereby takes place under a compressive stress, which is applied to the actuator body 20 such that it counteracts the elongating effect of the polarization field.

The piezoelectric characteristics of each of the poled actuator bodies 20 are then determined (FIG. 1, 104) and related to the determined characteristics of the respective unpoled actuator body 20 (FIG. 1, 105). The comparison of the determined individual relationships served to establish the applicable correlation between the initial state of the actuator body 20 and the poling state of the actuator body 20 for the type of actuator body 20.

The correlation thus established is used to characterize an actuator body 20. The actuator body 20 is measured in the initial state, in other words in the state after attachment of the metallic coatings (unpoled or weakly poled). The characteristic or characteristics used for the correlation is/are determined. The data thus obtained can be used to estimate the probability that after poling (including further processing steps) the actuator body 20 will have piezoelectric parameters that are within a specified tolerance range. Based on this estimation, the actuator body 20 is either supplied for further processing or excluded from further processing.

What is claimed is:

1. A method for establishing a correlation between a first state of a piezoelectric component having a piezoceramic element and a second state of the component, the second state of the component being generated from the first state of the component by polarization of the piezoceramic element of the component, with the following method steps:
  a) providing a group of components in a first state prior to being polarized;
  b) measuring at least one first parameter of each of the components of the group in the first state;
  c) polarizing the piezoceramic element of the components of the group such that the components are in a second, polarized state;
  d) measuring a second parameter of each of the components of the group in the second, polarized state, the second parameter being different than the at least one first parameter;
  e) establishing a correlation between the at least one first parameter and the second parameter by comparing the measurements of the at least one first parameter for the group of components in the first state with the measurements of the second parameter for the group of components in the second, polarized state; and
  f) determining whether to accept or reject a particular component based at least on a measurement of the at least one first parameter of the particular component in the first, pre-polarization state and the established correlation.

2. A method according to claim 1, wherein multiple first parameters of the component in the first state are determined and used to establish the correlation with a single second parameter of the component in the second state.

3. A method according to claim 1, wherein the specific characteristic of the component in the first state is selected from the group consisting of: loss angle of the piezoelectric layer, insulation resistance of the piezoelectric layer, density of the piezoelectric layer, relative permittivity of the piezoelectric layer, ferroelastic behavior of the component, module of elasticity of the component, longitudinal sound velocity of the component, and temperature sensitivity of the capacity of the component.

4. A method according to claim 1, wherein a lead zirconate titanate is used as the piezoceramic element.

5. A method according to claim 4, wherein the at least one first parameter includes a ratio of a rhombohedric part by volume with a rhombohedric phase and a tetragonal part by volume with a tetragonal phase.

6. A method according to claim 1, wherein the first state is characterized by partial polarization of the piezoceramic element for each component in the group.

7. A method according to claim 6, wherein for the purposes of partial polarization the piezoceramic element of the components is polarized without pressure at room temperature.

8. A method according to claim 6, wherein for the purposes of partial polarization the piezoceramic element of the components is polarized at a poling temperature that is higher than room temperature.

9. A method according to claim 6, wherein for the purpose of partial polarization a mechanical compressive stress is exerted on the piezoceramic element of the components.

10. A method according to claim 6, wherein for the purposes of partial polarization the component is heated to above the Curie temperature of the piezoceramic element and a polarization field with a low field strength of less than 100 V/mm is applied as the component cools to room temperature.

11. A method according to claim 1, wherein each piezoelectric component has at least one piezoelement with at least two electrode layers arranged one on top of the other and at least one piezoelectric layer, containing the piezoceramic element, arranged between the electrode layers.

12. A method according to claim 11, wherein each piezoelectric component comprises a multilayer actuator in which a number of piezoelements are arranged to form a stacked actuator body.

13. A method according to claim 1, wherein the quality of the particular component is judged based on a prediction made using the established correlation.

14. A method according to claim 1, wherein determining whether to accept or reject the particular component under analysis includes:
  measuring the at least one first parameter of the particular component;
  predicting a measurement of the second parameter of the particular component based on the established correlation; and
  determining whether to accept or reject the particular component based on a comparison of the predicting measurement of the second parameter with a specified tolerance range.

* * * * *